(12) United States Patent
Jurine et al.

(10) Patent No.: US 6,861,855 B2
(45) Date of Patent: Mar. 1, 2005

(54) HIGH DENSITY INTERCONNECTION TEST CONNECTOR ESPECIALLY FOR VERIFICATION OF INTEGRATED CIRCUITS

(75) Inventors: Jean-Michel Jurine, Nainville (FR); Isabelle George, Paris (FR)

(73) Assignee: Upsys Probe Technology SAS (FR)

( * ) Notice: Subject to any disclaimer, the term of this patent is extended or adjusted under 35 U.S.C. 154(b) by 318 days.

(21) Appl. No.: 09/735,684

(22) Filed: Dec. 13, 2000

(65) Prior Publication Data

US 2001/0031575 A1 Oct. 18, 2001

(30) Foreign Application Priority Data

Dec. 13, 1999 (FR) .............................. 99 15679

(51) Int. Cl.⁷ .............................................. G01R 31/02
(52) U.S. Cl. ....................... 324/754; 324/758; 324/72.5
(58) Field of Search ................................ 324/754, 758, 324/760, 761, 72.5; 439/482, 820, 70

(56) References Cited

U.S. PATENT DOCUMENTS

| | | | | | |
|---|---|---|---|---|---|
| 4,035,722 | A | * | 7/1977 | Ryabov et al. | 324/761 |
| 4,963,822 | A | * | 10/1990 | Prokopp | 324/758 |
| 4,964,808 | A | | 10/1990 | Riechelmann | |
| 5,015,947 | A | * | 5/1991 | Chism | 324/754 |
| 5,171,992 | A | * | 12/1992 | Clabes et al. | 250/306 |
| 5,247,250 | A | * | 9/1993 | Rios | 324/754 |
| 5,367,254 | A | * | 11/1994 | Faure et al. | 324/761 |
| 5,378,971 | A | * | 1/1995 | Yamashita | 324/760 |
| 5,482,038 | A | * | 1/1996 | Ruff | 439/482 |
| 5,611,942 | A | * | 3/1997 | Mitsui et al. | 216/67 |
| 5,952,843 | A | * | 9/1999 | Vinh | 324/754 |
| 6,043,563 | A | * | 3/2000 | Eldridge et al. | 257/784 |
| 6,242,929 | B1 | * | 6/2001 | Mizuta | 324/761 |
| 6,246,247 | B1 | * | 6/2001 | Eldridge et al. | 324/754 |
| 6,342,433 | B1 | * | 1/2002 | Ohmi et al. | 438/455 |
| 6,414,501 | B2 | * | 7/2002 | Kim et al. | 324/761 |
| 6,417,684 | B1 | * | 7/2002 | Schmid et al. | 324/761 |

FOREIGN PATENT DOCUMENTS

| | | |
|---|---|---|
| EP | 0 740 160 A1 | 10/1996 |
| WO | WO 97/43656 | 11/1997 |
| WO | WO 99/49329 | 9/1999 |

* cited by examiner

*Primary Examiner*—Kamand Cuneo
*Assistant Examiner*—Jermele Hollington
(74) *Attorney, Agent, or Firm*—Piper Rudnick LLP

(57) ABSTRACT

This invention pertains to a high density interconnection test connector intended especially for verification of integrated circuits, including a plate supporting a multiplicity of conductive pins one of the ends of which forms a contact zone with the electronic circuit to be tested and the other end forms a contact zone with a connecting plate that has a connection means with the test equipment, with the conductive pins presenting a form that is capable of ensuring flexibility and including a longitudinal component, characterized in that the pins present a succession of at least three arc-shaped sections (4, 5, 6) in alternating directions extended on both sides by rectilinear segments that are mobile according to one degree of freedom in axial translation, with the pins being inserted in the front plates.

11 Claims, 3 Drawing Sheets

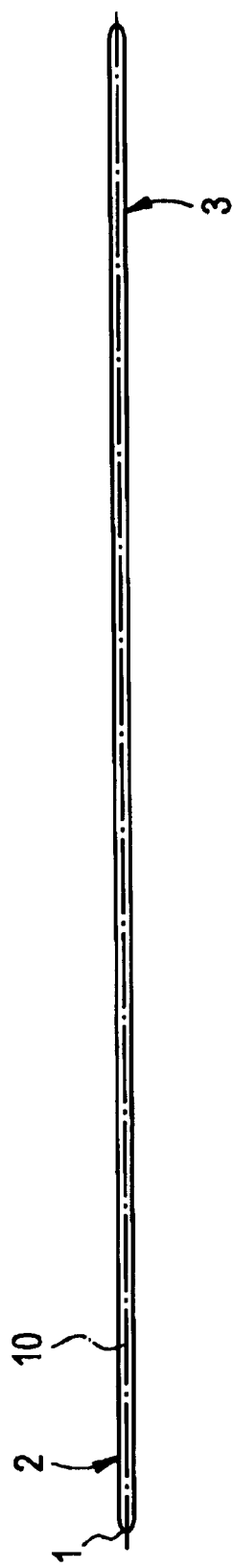
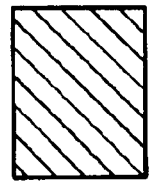
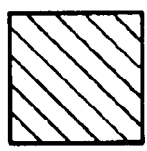
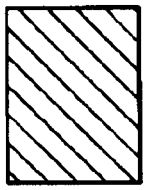

Mask

Oxide Layer

Support Layer

Metal

Pin

HIGH DENSITY INTERCONNECTION TEST CONNECTOR ESPECIALLY FOR VERIFICATION OF INTEGRATED CIRCUITS

FIELD OF THE INVENTION

This invention pertains to the field of test equipment for high density integrated circuits.

BACKGROUND

Known in the state of the art are connectors that enable application of a large number of points on the surface of the integrated circuit to be verified. Such circuits have a dense grid of pins the contact end of which is mobile to allow adaptation to defects in the surface evenness of the circuits to be verified and to defects in the processing equipment. These pins are electrically connected to a wire harness for connection to control equipment.

As an example, European patent EP 68270 describes an electric test unit comprising a multiplicity of elongated test elements constituted of a flexible, conductive material and spaced-apart upper and lower support elements with orifices through which pass the ends of said test elements. The lower support element maintains these tests elements in an essentially parallel arrangement, in a configuration corresponding to that of the pins to be contacted.

Also known is European patent EP 735372 which describes an assembly of pins traversing a perforated plate and comprising spring elements that exert pressure on the contact surface. European patent EP 528608 describes a connector for testing an integrated circuit unit which is surface mounted on a printed circuit card and presents an essentially rectangular configuration including an upper surface, a lower surface and four lateral sides. A series of electric conductors extends from at least one of said lateral sides.

The connector comprises:
- a connector box which has an essentially rectangular recess that can fit above the integrated circuit unit;
- at least one comb made of insulating material and equipped with a series of teeth that extend laterally towards the interior of the recess from the connector box with a predefined spacing between each pair of adjacent teeth, with the teeth being capable of being inserted in a removable manner between the conductors when the connector box is fitted above the integrated circuit unit;
- a frame assembly of conductors attached to the connector box inside the recess;
- a flexible cable that includes a series of conductors extending in parallel from the connector box to a second connector that can implement the electric connections with an external test unit; and
- a series of conductive pins mounted in the orifices provided with a coating of the insulating layer which can implement the interconnections.

The problem posed by the connectors of the prior art is that of the density of the pins and the miniaturization of the contacts. This density is limited by the deformations of the pin during application on the surface of the integrated circuit to be verified and by the necessity of absolutely avoiding any contact between adjacent pins. A second problem is that of controlling the course—force function. The objective is to work in the part of the displacement/force curve corresponding to saturation to ensure an almost constant tracking force irrespective of the extension of the end of the pin. This characteristic makes it possible to ensure an identical tracking force for all of the pins even when the contact surface exhibits defects in surface evenness.

SUMMARY OF THE INVENTION

The invention relates to a high density interconnection test connector for verification of integrated circuits including a plate supporting a multiplicity of conductive pins, the pins having end portions which form a contact zone with an electronic circuit to be tested and other end portions which form a contact zone with a connecting plate that has a connection with equipment to be tested, the conductive pins including a longitudinal component and having a succession of at least three arc-shaped sections arranged in alternating directions and that are movable by one degree of freedom in axial translation relative to rectilinear segments of the pins, and wherein the pins are inserted in the plates. The invention also relates to a process for manufacturing of a pin, including machining an SOI type substrate with a mask by dry deep etching, etching an oxide layer on the resulting substrate to release multiple pins from the support, depositing a metal on the released pins, and cutting out single pins.

BRIEF DESCRIPTION OF THE DRAWINGS

Better comprehension of the invention will be obtained from the description below which refers to a nonlimitative example of implementation and to the attached figures in which:

FIG. 2 shows a side view of the pin according to the invention.

FIG. 3 shows an enlarged view of the contact end of the pin.

FIGS. 4 to 6 show sectional views of the pin along the section planes AA, BB and CC, respectively.

DETAILED DESCRIPTION

Figure 1A:
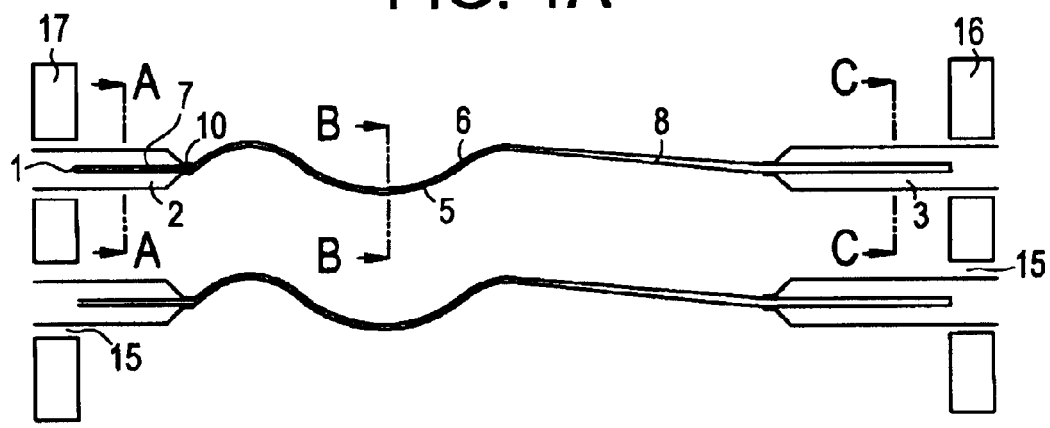
FIG. 1(a) shows a front view of an interconnect test connector according to the invention.

The following description is intended to refer to specific embodiments of the invention illustrated in the drawings and is not intended to define or limit the invention, other than in the appended claims. Also, the drawing(s) is/are not to scale and various dimensions and proportions are contemplated.

This invention provides a high density interconnection test connector intended especially for verification of integrated circuits. The connector comprises a plate supporting a multiplicity of conductive pins, one of the ends of which forms a contact zone with the electronic circuit to be tested and the other end forms a contact zone with a connecting plate that has a connection means with the test equipment. The conductive pins present a form that is capable of ensuring flexibility and including a longitudinal component, characterized in that the pins present a succession of at least three arc-shaped sections in alternating directions extended on both sides by rectilinear segments that are mobile according to one degree of freedom in axial translation, with the pins being inserted in the front plates.

According to a preferred mode of implementation, the pins present a succession of three arc-shaped sections. According to a variant, the arc-shaped sections present lengths that increase from the point to the attachment plate.

According to a preferred mode of implementation, the first arc-shaped segment presents a length $L_1$, the second section presents a length of approximately 1.5 $L_1$ and the third segment presents a length of approximately 2.1 $L_1$.

According to a particular mode of implementation, the first arc-shaped segment presents a length $L_1$=480 micrometers, the second segment presents a length of approximately 700 micrometers and the third segment presents a length of approximately 1000 micrometers.

The first arc-shaped segment preferably presents a form defined by the function $$y_1(x) = b_1 \cdot \left( 1 - \frac{2}{1+e^{\left(\frac{\left(\frac{L_1}{2}\right)^2 - x^2}{a_1^2}\right)}} \right)$$

in which $b_1$ is equal to about 500, $a_1$ is equal to about 300, $L_1$ is equal to about 480 micrometers.

The second arc-shaped segment advantageously presents a form defined by the function $$y_2(x) = b_2 \cdot \left( 1 - \frac{2}{1+e^{\left(\frac{\left(\frac{L_2}{2}\right)^2 - x^2}{a_2^2}\right)}} \right)$$

in which $b_2$ is equal to about 300, $a_2$ is equal to about 300, $L_2$ is equal to about 700 micrometers.

The third arc-shaped segment advantageously presents a form defined by the function $$y_3(x) = b_3 \cdot x \cdot \left( \frac{1}{e^{a_3 x}} - \frac{1}{e^{a_3 L_3}} \right)$$

in which $b_3$ is equal to about 1, $a_3$ is equal to about 0.005, $L_3$ is equal to about 1000 micrometers.

According to a particular mode of implementation, the rectilinear segment is guided along a length of about 300 micrometers and starts at a distance of about 100 micrometers from the third arc-shaped segment.

The invention also pertains to a process for the manufacture of a pin for a connector, characterized in that one prepares an SOI type substrate formed by two silicon substrates fused with a silicon oxide interface layer, in that one machines according to a mask by dry deep etching, in that one then etches the silicon oxide layer, in that one implements a metal deposit by cathode sputtering and/or chemical deposition and in that one then releases the elements.

According to a variant, the pin is made by direct chemical etching in a metal plate of the tungsten, palladium, copper or equivalent type. The invention also pertains to integrated circuit test equipment characterized in that it comprises a connector in accordance with the invention.

Figure 1B:
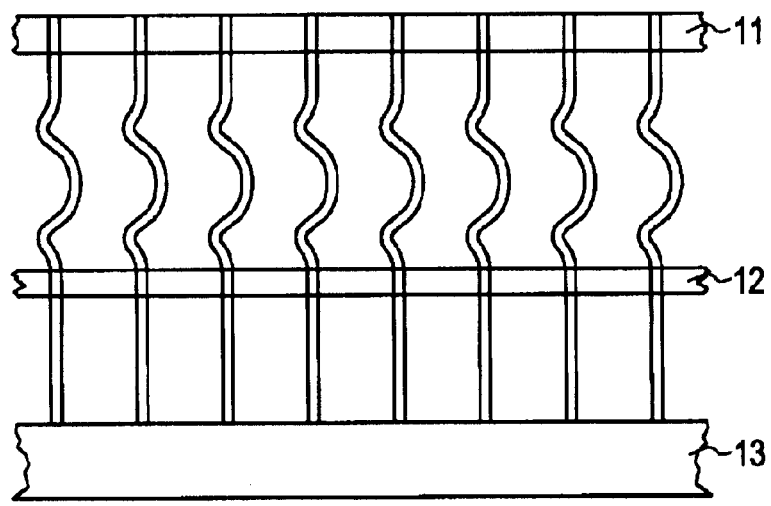
FIG. 1(b) shows a front view of an interconnect test connector according to the invention.
Figure 1C:
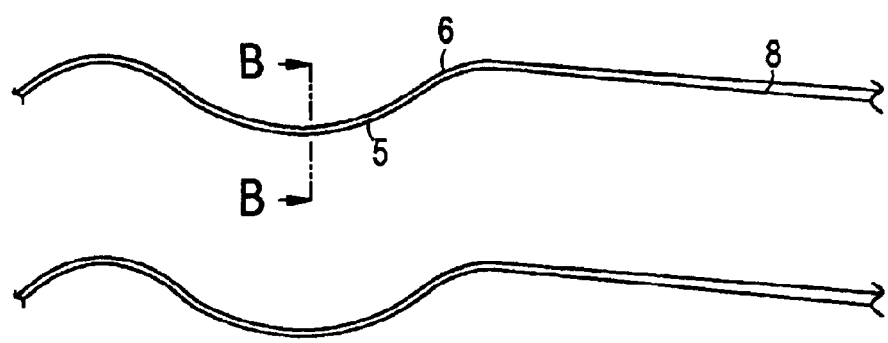
FIG. 1(c) shows a front isolated view of the three arc-shaped segments.

Turning now to the drawings and FIGS. 1(a), 1(b), and 2 in particular, the pin according to the invention presents a contact end portion (1) located at the end of a rectilinear segment (2) the median axis of which merges with the median axis of the rectilinear segment (3) that forms the opposite end portion of the pin.

Between these two segments, the pin includes:

a first arc-shaped segment (4), a second arc-shaped segment (5), a third arc-shaped segment (6).

At rest, the first segment presents a bulge. It is joined to the second segment (5) by a connection slope that forms an angle of approximately 45° with the longitudinal axis (7). The connection with the rectilinear segment (2) is effected with an abrupt variation of the slope. The tangent to the end of the first arc-shaped segment (4) forms an angle of approximately 45° with the median axis of the rectilinear segment (2).

The second arc-shaped segment (5) also forms a bulge in the direction opposite to that of the bulge of the first arc-shaped segment. The third segment presents a bulge with an amplitude in the same direction as the first bulge. The connection with the rectilinear segment (3) is implemented by a slightly dished zone (8).

The contact end portion (1) presents a trapezoidal zone as shown in enlarged view in FIG. 3. The slope of the sides is approximately 60°. The flat front part presents the form of a square.

The rectilinear segment (2) presents a rectangular section as shown in FIG. 4. The arc-shaped part (5) presents a square section as shown in FIG. 5. The rectilinear part (3) presents a rectangular section as shown in FIG. 6.

The front rectilinear segment (2) presents close to the connection zone with the first arc-shaped segment (4) a shoulder (10) with a thickness of about 0.015 millimeters. This shoulder enables exertion of a prestressing on the pin when it is introduced between the two perforated plates that form the connector.

The pins constructed in this manner are inserted in a known manner between two plates (11, 12) presenting a grid of perforations so as to ensure the guiding of the rectilinear ends (2, 3) to the image of the contacts of the integrated circuit 13 to be verified. Possibly, only the rear segment (3) could be guided, with the front segment (2) being free. The pitch of the grid can reach about 50 micrometers with the pins according to the invention.

The pins can be mounted in a prestressed manner. They are in this case positioned between two plates which are spaced apart by a distance slightly shorter than the distance between the shoulders of the pin to exert an axial stress at rest on the pins.

Manufacture of the pins can be implemented by a cutting technique from an SOI (Silicon On Insulator) type substrate formed by an N or P support of doped type [100] in a manner such as to present the smallest possible resistance and a shoulder of several tens of micrometers.

Figure 7:
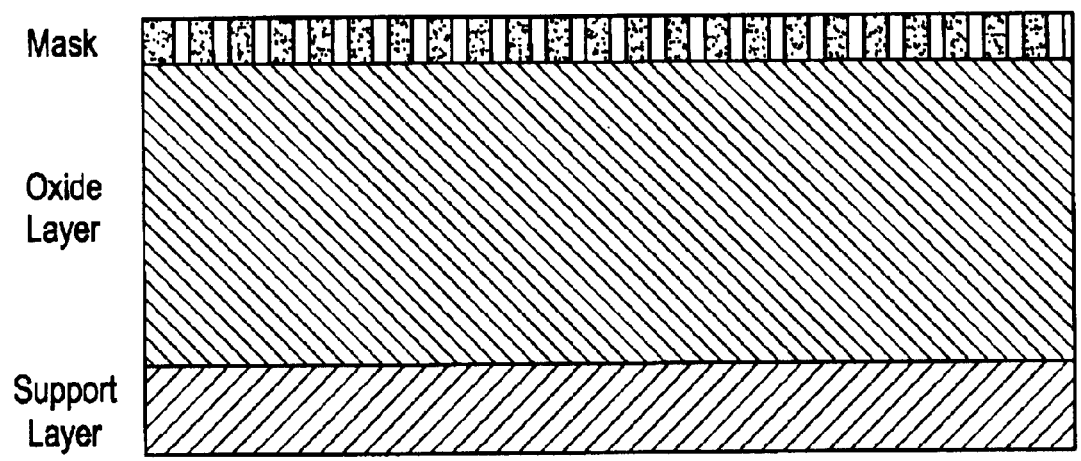
FIG. 7 shows a preferred embodiment of the SOI substrate and mask in accordance with aspects of the invention.

As show in FIG. 7, manufacture of the pins can be implemented by a cutting technique from an SOI (Silicon On Insulator) type substrate formed by an N or P support of dope type [100] in a manner such as to present the smallest possible resistance and a shoulder of several tens of micrometers.

This substrate is machined with a mask by means of deep etching of the silicon using a high-density plasma with inductive coupling which enables attainment of high etching rates, noteworthy selectivities and vertical etchings independently of the crystalline orientation of the substrate. This process makes it possible to ensure a square section of the pins.

Figure 8:
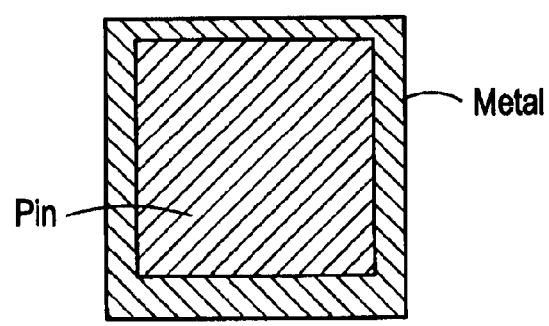
FIG. 8 shows a sectional view of the pin along section plane BB with metal deposited thereon in accordance with aspects of the invention.

The oxide layer is then etched with hydrofluoric acid so as to release the pins from the support. A metal deposit is then implemented by cathode sputtering or PVD (plasma vapor deposition) or CVD (chemical vapor deposition) prior to cutting out the pins so as to separate the adjacent elements. A cross-section of a pin with metal deposited thereon is shown in FIG. 8.

What is claimed is:

1. A high density interconnection test connector for verification of integrated circuits comprising:
   a connecting plate for connecting to equipment to be tested;
   a plurality of conductive pins, each of said pins having an end portion having a rectilinear segment to contact an integrated circuit to be tested and other end portion having another rectilinear segment to contact said connecting plate, wherein each of said conductive pins includes a longitudinal component having a succession of at least three are-shaped sections, said arc-shaped sections being arranged in alternating directions and being movable by at least one degree of freedom in axial translation relative to said rectilinear segments of the pin and wherein said pins are comprised substantially of silicon; and
   a support plate for supporting said plurality of pins wherein said plurality of pins are inserted through said support plate;
   wherein a first one of said arc-shaped sections has a length of about 480 micrometers as measured from the beginning to the end of said first arc-shaped section, a second one of the said arc-shaped sections has a length of about 700 micrometers and a third one of said arc-shaped sections has a length of about 1000 micrometers.

2. The high density interconnection test connector according to claim 1, wherein a first one of said arc-shaped sections has a form defined by the function:

$$y_1(x) = b_1 \cdot \left(1 - \frac{2}{1+e^{\left(\frac{\left(\frac{L_1}{2}\right)^2 - x^2}{a_1^2}\right)}}\right).$$

3. The high density interconnection test connector according to claim 1, wherein a second one of said arc-shaped sections has a form defined by the function:

$$y_2(x) = b_2 \cdot \left(1 - \frac{2}{1+e^{\left(\frac{\left(\frac{L_2}{2}\right)^2 - x^2}{a_2^2}\right)}}\right).$$

4. The high density interconnection test connector according to claim 1, wherein a third one of said arc-shaped sections has a form defined by the function:

$$y_3(x) = b_3 \cdot x \cdot \left(\frac{1}{e^{a_3 x}} - \frac{1}{e^{a_3 L_3}}\right).$$

5. A high density interconnection test connector for verification of integrated circuits comprising:
   a connecting plate for connecting to equipment to be tested; and
   a plurality of conductive pins, each of said pins having an end portion having a rectilinear segment to contact an electronic circuit to be tested and another end portion having another rectilinear segment to contact said connecting plate, wherein each of said conductive pins includes a longitudinal component having a succession of at least three arc-shaped sections, said arc-shaped sections being arranged in alternating directions and being movable by at least one degree of freedom in axial translation relative to said rectilinear segments of said pin;
   wherein a first one of said arc-shaped sections has a form defined by the function:

$$y_1(x) = b_1 \cdot \left(1 - \frac{2}{1+e^{\left(\frac{\left(\frac{L_1}{2}\right)^2 - x^2}{a_1^2}\right)}}\right).$$

6. The high density interconnection test connector according to claim 5, wherein a second one of said arc-shaped sections has a form defined by the function:

$$y_2(x) = b_2 \cdot \left( 1 - \cfrac{2}{1+e^{\left(\cfrac{\left(\frac{L_2}{2}\right)^2 - x^2}{a_2^2}\right)}} \right).$$

7. The high density interconnection test connector according to claim 5, wherein a third one of said arc-shaped sections has a form defined by the function:

$$y_3(x) = b_3 \cdot x \cdot \left( \frac{1}{e^{a_3 x}} - \frac{1}{e^{a_3 L_3}} \right).$$

8. A conductive pin for a high density interconnection test connector having a connecting plate for connecting to equipment to be tested to be used in the verification of integrated circuits comprising:
- an end portion having a rectilinear segment to contact said electronic circuit;
- another end portion having another rectilinear segment to contact said connecting plate; and
- a longitudinal component having a succession of at least three arc-shaped sections, said arc-shaped sections being arranged in alternating directions and being movable by at least one degree of freedom in axial translation relative to said rectilinear segments of said pin;
- wherein a first one of said arc-shaped sections has a length of about 480 micrometers as measured from the beginning to the end of said first arc-shaped section, a second one of said arc-shaped sections has a length of about 700 micrometers and a third one of said arc-shaped sections has a length of about 1000 micrometers.

9. The high density interconnection test connector pin according to claim 8, wherein a first one of said arc-shaped sections has a form defined by the function:

$$y_1(x) = b_1 \cdot \left( 1 - \cfrac{2}{1+e^{\left(\cfrac{\left(\frac{L_1}{2}\right)^2 - x^2}{a_1^2}\right)}} \right).$$

10. The high density interconnection test connector pin according to claim 8, wherein a second one of said arc-shaped sections has a form defined by the function:

$$y_2(x) = b_2 \cdot \left( 1 - \cfrac{2}{1+e^{\left(\cfrac{\left(\frac{L_2}{2}\right)^2 - x^2}{a_2^2}\right)}} \right).$$

11. The high density interconnection test connector pin according to claim 8, wherein a third one of said arc-shaped sections has a form defined by the function:

$$y_3(x) = b_3 \cdot x \cdot \left( \frac{1}{e^{a_3 x}} - \frac{1}{e^{a_3 L_3}} \right).$$

\* \* \* \* \*